Figure 1:
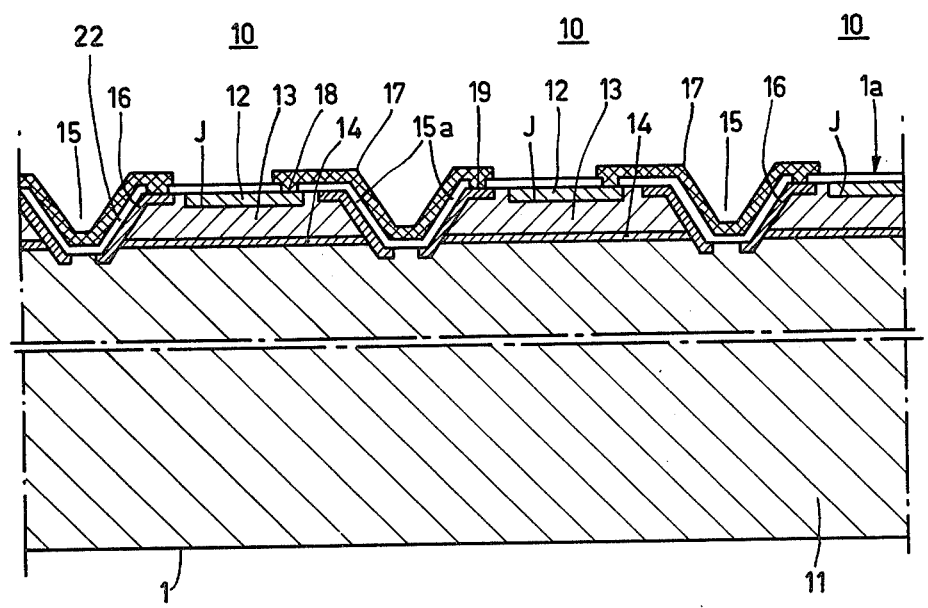

United States Patent [19]

David

[11] 4,219,368
[45] Aug. 26, 1980

[54] SEMICONDUCTOR DEVICE HAVING A NUMBER OF SERIES-ARRANGED PHOTOSENSITIVE CELLS

[75] Inventor: Gérard R. David, Cambes en Plaine, France

[73] Assignee: U.S. Philips Corporation, New York, N.Y.

[21] Appl. No.: 37,784

[22] Filed: May 10, 1979

[30] Foreign Application Priority Data

May 19, 1978 [FR] France .................................. 78 14890

[51] Int. Cl.² ........................................... H01L 31/06
[52] U.S. Cl. ................................ 136/89 MS; 357/30; 357/47; 357/48; 357/55
[58] Field of Search .............. 136/89 MS; 357/30, 47, 357/48, 55

[56] References Cited

U.S. PATENT DOCUMENTS

| | | | |
|---|---|---|---|
| 3,546,542 | 12/1970 | Riel et al. .................................. | 357/30 |
| 3,994,012 | 11/1976 | Warner, Jr. ............................... | 357/30 |
| 4,110,122 | 8/1978 | Kaplow et al. ................... | 136/89 MS |
| 4,144,096 | 3/1979 | Wada et al. ....................... | 136/89 MS |
| 4,156,309 | 5/1979 | Routh et al. ............................ | 29/572 |

FOREIGN PATENT DOCUMENTS 1010476 11/1965 United Kingdom ................ 136/89 MS

OTHER PUBLICATIONS

A. I. Bennett et al., "An Integrated High-Voltage Solar Cell," *Conf. Record, IEEE Photovoltaic Specialists' Conf.* (1967), pp. 148–159.

*Primary Examiner*—Aaron Weisstuch
*Attorney, Agent, or Firm*—Thomas A. Briody; Steven R. Biren

[57] ABSTRACT

A semiconductor device having a number of series-arranged photosensitive cells which are provided on a common substrate of a first conductivity type and which are separated by grooves extending down to the substrate. The cells consist of first regions of a first conductivity type which form planar photosensitive junctions with second regions of the second conductivity type. According to the invention, a highly doped layer of the second conductivity type is present between the substrate and the second region and each photosensitive cell is provided, along at least a part of its circumference, with a highly doped semiconductor zone of the second conductivity type which extends along the wall of the groove down to the highly doped layer and is separated from the adjacent cell by the substrate.

5 Claims, 6 Drawing Figures

SEMICONDUCTOR DEVICE HAVING A NUMBER OF SERIES-ARRANGED PHOTOSENSITIVE CELLS

This invention relates to a semiconductor device for converting electromagnetic radiation into electrical energy, having a monocrystalline semiconductor body comprising a number of series-arranged photosensitive cells, in which each cell has a first region of a first conductivity type which, within the semiconductor body, is surrounded by a second region of a second conductivity type and in which the first and second regions adjoin a major surface of the semiconductor body on which the radiation is incident and form planar photosensitive p-n junctions, in which the photosensitive cells are situated on a common semiconductor substrate of the first conductivity type and are separated from each other by grooves extending from the major surface into the substrate, in which on the major surface the first region of a photosensitive cell is conductively connected to the second region of an adjacent cell.

Such a semiconductor device is known from British Patent Specification No. 1,010,476.

In many cases, for example in radiotechnology and in the watch-making industry, the use of photosensitive cells, for example in the form of solar batteries, is of advantage. Since a separate photosensitive cell only provides a voltage of less than 1 Volt, series arrangement of several cells is usually desired.

The photosensitive cells may each individually be mounted on an insulating support and be connected in series by means of wiring. This often has disadvantages, *inter alia* as regards the adhesion of the conductors and due to the fact that the photosensitive surfaces are not rigorously situated in one plane, which is usually desired.

Although the semiconductor device known from British Patent Specification No. 1,010,476 shows a mechanically rigid monocrystalline structure having a common coplanar photosensitive surface, the connection conductors are in contact with comparatively low-doped regions separated by grooves so that it may be difficult to realize low-ohmic contacts and undesired series resistances may also occur. Moreover, photons may penetrate into the substrate and generate charge carriers there as a result of which the electrical separation between adjacent photosensitive cells is reduced.

One of the objects of the invention is to remove the disadvantages associated with the said known device or at least reduce them to a considerable extent and to provide a monolithic device having series-arranged photosensitive cells having a good electrical separation between the cells in which the mutual electrical connections can be provided in a simple manner.

According to the invention, a semiconductor device of the kind described above is characterized by a highly doped intermediate layer of the second conductivity type located between each second region and the substrate, and each photosensitive cell is surrounded over at least a part of its circumference by a highly doped semiconductor zone of the second conductivity type extending along the wall of the groove of the major surface down to the said intermediate layer, said highly doped semiconductor zone of the second conductivity type being separated from the semiconductor zones belonging to the adjacent cells by the substrate.

Due to the presence of the said highly doped intermediate layer, photons cannot penetrate from the second region into the substrate so that good electrical separation between the cells is obtained. The semiconductor zone, which extends along the walls of the groove, together with the intermediate layer serves as a low-ohmic electrical connection with the second region and can easily be provided, for example, by a shallow diffusion, in contrast with the deep diffusions which would be necessary in the absence of a groove and would require a much longer diffusion time and in addition much more space.

The mechanically and electrically reliable, completely integrated structure of the device according to the invention permits of manufacturing devices having an area up to approximately 35 cm$^2$.

The said semiconductor zone extending along the walls of the groove preferably has an extension along the major surface. The series arrangement of two adjacent cells is advantageously realized by a metal layer which adjoins the first region of the first cell and the extension of the semiconductor zone of the second cell. The metal layers preferably extend on the major surface and along the wall of the grooves and are separated from the semiconductor surface by an insulating layer.

According to an important preferred embodiment, the semiconductor body is a silicon plate the major surfaces of which are substantially of (100) crystallographic orientation, the walls of the grooves having a (111) crystallographic orientation. As is known, these V-shaped grooves can be obtained in a very simple manner by means of a selective etching liquid containing e.g. potassium hydroxide. The walls of the grooves then have an inclination which corresponds substantially to an angle of 55° (54° 50') between the groove walls and the major surface. With such an inclination it is possible to cause the metal layer to extend over the edges of the grooves without running the risk of interrupting the connections.

Since in the case of the chemical etching of grooves in crystallographic (100) faces with, for example, a KOH-containing etchant, the etching rate in directions perpendicular to the said surfaces is considerably larger than the etching rate in directions which are parallel to the said surfaces, with the same depth and with the same dimensions of the etching apertures, the resulting grooves are hence narrower than grooves which are provided in surfaces extending, for example, according to crystallographic (111) faces. This results in an important space saving.

The invention will now be described in greater detail with reference to the drawing, in which:

FIG. 1 is a cross-sectional view of a part of a monolithic semiconductor device having several series-arranged photosensitive cells according to the invention, and FIG. 2a to 2e show successive states of the manufacture of a device shown in FIG. 1.

The monolithic semiconductor device shown in FIG. 1 comprises several photosensitive cells 10 adjoining the major surface 1a of a semiconductor plate 1, the light being incident via the said major surface 1a. The plate 1 includes a region 11 of a first conductivity type which forms the common substrate of the cells 10 formed thereon.

Each cell 10 comprises a first region 12 of the first conductivity type which, within the semiconductor body, is surrounded by a second region 13 of the second conductivity type. The said regions 12 and 13 adjoin the major surface 1a. At their interfaces the said regions 12 and 13 defined a planar photosensitive junction J. According to the invention, a highly doped intermediate layer 14 of the second conductivity type is present between the second region 13 and the substrate 11.

The expression "highly doped" is to be understood to mean herein a doping concentration of at least $10^{19}$ atoms/cm$^3$, as a result of which the said semiconductor material obtains its highly conductive properties.

Each cell is bounded laterally by a groove 15 extending from the major surface 1a into the substrate 11.

According to the invention, each photosensitive cell is furthermore surrounded over at least a part of its circumference by a highly semiconductor zone 16 of the second conductivity type extending along the wall 15a of the groove 15 from the major surface 1a down to the intermediate layer 14, said semiconductor zone 16 being separated from the semiconductor zones 16 belonging to the adjacent cells by the substrate 11.

The cells are connected in series by conductive layers 17 extending from a contact zone 18 on the first region of a cell up to another contact zone 19 present on the semiconductor zone 16 of another cell and which are separated from the semiconductor surface by an insulating layer 22. In principle, it is possible to provide the contact zones on the wall of the grooves 15 since the zone 16 adjoins said wall; however, since it is difficult to provide a window on an inclined surface, it is better to form the contact zones 19 on the major surface, namely on an extension of the zone 16.

It is otherwise not necessary for the zone 16 to surround a cell completely, nor is it necessary for the depth of zone 16 to extend to beyond the intermediate layer 14, as is shown in FIG. 1.

Starting material for the manufacture of the device shown in FIG. 1 is a monocrystalline silicon substrate 11, the thickness of which is approximately 300 microns and the surfaces of which are parallel to the (100) faces of the crystal lattice; the substrate is, for example, n conductive and the resistivity thereof is from 0.1 ohm.cm to 1 ohm.cm.

Figure 2A:
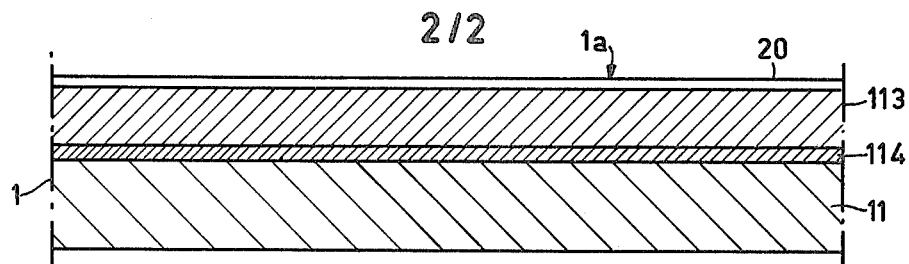

As seen in FIG. 2A via diffusion or boron implantation a P+ conductive zone 114 is formed on a surface of the said substrate, the boron concentration being approximately $10^{19}$ atoms/cm$^3$ and the thickness of the said zone 114 being from 2 to 3 microns.

A P conductive epitaxial layer 113 is then provided on the zone 114 having a dopant concentration of $10^{15}$ to $10^{16}$ atoms/cm$^3$ and a thickness from 15 to 20 microns.

The layer 113 is then covered with a silicon oxide layer 20, the thickness of which is from 0.2 to 0.5 micron.

The plate 1 obtained in this manner is shown in FIG. 2a.

Figure 2B:
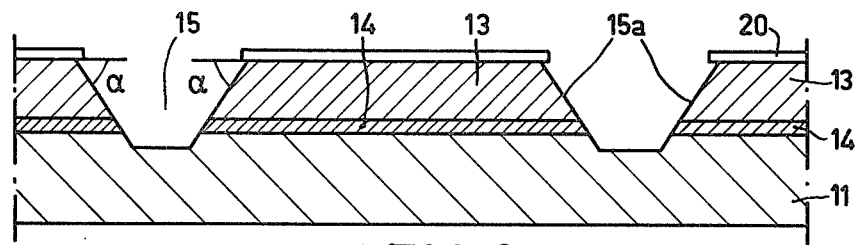

As seen in FIG. 2b apertures having a width from 50 to 100 microns are then provided in the layer 20, and grooves 15 laterally bounding the future cells 10 are etched chemically in the plate 1. The said grooves extend into the substrate 11 and in this example have a flat bottom situated in the substrate 11.

The walls 15a of the grooves 15 have an angle of inclination $\alpha = 54°50'$ with respect to the major surface 1a of the plate 1. The said angle of 54°50' corresponds to the angle between a (100) crystallographic face and a (111) crystallographic face.

Undercutting occurring below the layer 20 is small due to the orientation of the surface 1a according to the (100) crystallographic face.

Figure 2C:
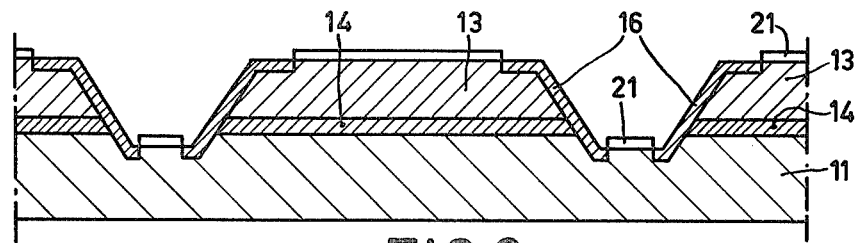

As next shown in FIG. 2c, a fresh silicon oxide mask 21 is then formed which protects the bottom of the grooves 15 and a part of the upper surface of the future cells 10, after which, for example by diffusion, P+ conductive boron-doped semiconductor zones 16 are provided with a boron concentration of $10^{19}$ atoms/cm$^3$ and a thickness of from 1$\mu$ to 2$\mu$.

Figure 2D:
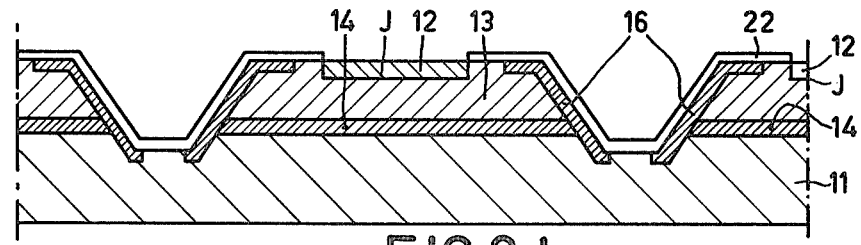

Refering now to FIG. 2d, a further silicon oxide mask 22 is then formed on the structure which leaves surface parts on the major surface 1a of the plate exposed, in which the N+ conductive first region 12 of the various cells is formed. This may be done by a phosphorus diffusion to a thickness of 0.5 micron. The sheet resistance of the material of the regions 12 is, for example, from 30 to 50 ohm/square.

Figure 2E:
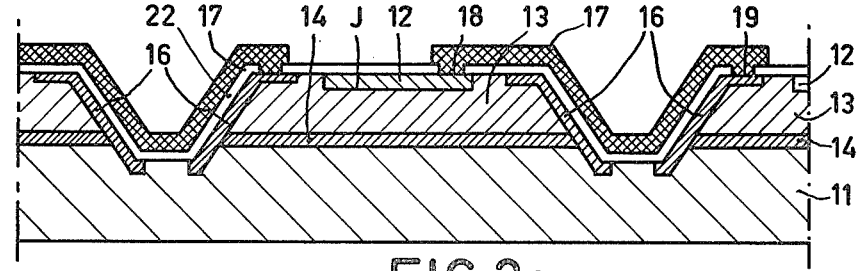

After a light reoxidation of the plate, contact windows 18 and 19 are then provided in the layer 22 on the upper surface of each cell, on the regions 12 and the zones 16, after which a network of conductors 17 is formed by vapor deposition and etching of, for example, an aluminium layer so as to connect the cells in series. The resulting device is shown in FIG. 2e.

In the above described example the substrate 11 is N conductive, the first region 12 is N+ conductive, the second region 13 is P conductive, the intermediate layer 14 is P+ conductive and the zone 16 is also P+ conductive. The invention may also be used in the case of opposite conductivity types, that is to say, a P conductive substrate 11, a P+ conductive first region 12, an N conductive second region 13, an N+ conductive intermediate layer 14, and an N+ conductive zone 16. The insulating layer 22 may also be any other insulating layer, for example, a silicon nitride layer or a composed insulating layer, instead of an oxide layer.

What is claimed is:

1. A semiconductor device for converting electromagnetic radiation into electrical energy, having a monocrystalline semiconductor body comprising a number of series-arranged photosensitive cells, in which each cell has a first region of a first conductivity type which, within the semiconductor body, is surrounded by a second region of a second conductivity type, and in which the first and second regions adjoin a major surface of the semiconductor body on which the radiation is incident and form planar photosensitive p-n junctions, in which the photosensitive cells are situated on a common semiconductor substrate of the first conductivity type and are separated from each other by grooves extending from the major surface into the substrate, in which on the major surface the first region of a photosensitive cell is conductively connected to the second region of an adjacent cell, characterized in that a highly doped intermediate layer of the second conductivity type is present between each second region and the substrate, and in that each photosensitive cell is surrounded over at least a part of its circumference by a highly doped semiconductor zone of the second conductivity type extending along the wall of the groove of the major surface down to the said intermediate layer, said highly doped semiconductor zone of the second conductivity type being separated from the semiconductor zones belonging to the adjacent cells by the substrate.

2. A semiconductor device as claimed in claim 1, characterized in that said semiconductor zone of the second conductivity type has an extension along a part of the major surface.

3. A semiconductor device as claimed in claim 2, characterized in that the series arrangement of each pair of adjacent cells is produced by a metal layer adjoining the first region of the first cell and the extension of the semiconductor zone of the second cell.

4. A semiconductor device as claimed in claim 3, characterized in that the metal layers extend on the major surface and along the wall and bottom of the grooves and are separated from the semiconductor surface by an insulating layer.

5. A semiconductor device as claimed in any one of the preceding claims, characterized in that the semiconductor body is a silicon plate, the major surfaces of which have substantially a (100) orientation and in that the walls of the grooves have a (111) orientation.

* * * * *